United States Patent
Maruyama et al.

[11] Patent Number: 6,166,966
[45] Date of Patent: Dec. 26, 2000

[54] SEMICONDUCTOR MEMORY DEVICE INCLUDING DATA OUTPUT CIRCUIT CAPABLE OF HIGH SPEED DATA OUTPUT

[75] Inventors: Yukiko Maruyama; Yutaka Ikeda; Kyoji Yamasaki, all of Hyogo, Japan

[73] Assignee: Mitsubihsi Denki Kabushiki Kaisha, Tokyo, Japan

[21] Appl. No.: 09/479,258

[22] Filed: Jan. 7, 2000

[51] Int. Cl.$^7$ ........................................ G11C 7/00
[52] U.S. Cl. ........................ 365/189.05; 365/189.11
[58] Field of Search .................. 365/189.11, 189.05, 365/189.01

[56] References Cited

U.S. PATENT DOCUMENTS

| | | | |
|---|---|---|---|
| 4,882,507 | 11/1989 | Tatsumi et al. | 365/189.05 |
| 5,663,912 | 9/1997 | Yamauchi | 365/189.05 |
| 5,831,908 | 11/1998 | Tsuji | 365/189.05 |
| 5,949,721 | 9/1999 | Kwon et al. | 365/189.05 |
| 5,959,900 | 9/1999 | Matsubara | 365/189.05 |
| 6,052,329 | 4/2000 | Nishino et al. | 365/189.05 |

FOREIGN PATENT DOCUMENTS 1-304750  12/1989  Japan.

*Primary Examiner*—Tan T. Nguyen
*Attorney, Agent, or Firm*—McDermott, Will & Emery

[57] ABSTRACT

A semiconductor memory device includes an output control signal generation circuit for generating an output control signal to designate initiation of data output according to an external control signal, and a boosting circuit boosting an external power supply voltage. Each of the plurality of output control circuits generates an output permit signal with the output level of the boosting circuit as the activation level in response to activation of an output control signal. The output permit signals are transmitted to a plurality of output circuits by a corresponding one of a plurality of signal lines. Each of the plurality of output circuits drives the potential of a corresponding output terminal according to a read out data signal and an output permit signal.

10 Claims, 7 Drawing Sheets

SEMICONDUCTOR MEMORY DEVICE INCLUDING DATA OUTPUT CIRCUIT CAPABLE OF HIGH SPEED DATA OUTPUT

BACKGROUND OF THE INVENTION

1. Field of the Invention

The present invention relates to the structure of a data output circuit of a semiconductor memory device.

2. Description of the Background Art

In accordance with the increase in speed of recent systems, high speed operation is required even for the dynamic type semiconductor memory device incorporated in the system. Practical application of a synchronous type semiconductor memory device and the like is in progress.

A trend is towards increasing the bit width in the data input/output of a semiconductor memory device for the purpose of providing flexibility in designing the system that incorporates the semiconductor memory device and reducing the size of the system.

In other words, when the semiconductor memory device includes n (n: natural number) data input/output terminals and data is received or sent with respect to an external source through the n data input/output terminals, the trend of increase in the number of the n data input/output terminals is identifiable.

FIG. 7 is a schematic block diagram showing a structure of an output circuit 800 controlling the data output timing in a conventional semiconductor memory device.

Output circuit 800 includes an output control signal generation circuit 810 receiving external control signals such as a row address strobe signal/RAS, a column address strobe signal/CAS, an output enable signal/OE and a write enable signal/WE and generating an output control signal OEM when data output is specified by a certain combination of these control signals, and a timing control circuit 820 receiving output control signal OEM to generate a signal VPO to control the data output timing.

Timing control circuit 820 includes a high voltage generation circuit 822 receiving an external power supply voltage Vcc and a ground potential GND to generate a high voltage Vpp used in data output, and an output control circuit 824 receiving the output of high voltage generation circuit 822 to output an output activation control signal VPO having an activation level that corresponds to high voltage Vpp in response to activation of output control signal OEM.

Output circuit 800 further includes output circuits 840.1~840.n provided corresponding to data input/output terminals DQ0~DQn–1, respectively, having the timing controlled by output activation control signal VPO to drive the potential level of corresponding data input/output terminals DQ0~DQn–1 according to received readout data RD0~RDn–1, respectively.

By the above structure, data RD0~RDn read out from a memory cell array (not shown) can be output to data input/output terminals DQ0~DQn–1 at one time.

It is to be noted that the structure shown in FIG. 7 has the plurality of output circuits controlled by timing control circuit 820. Therefore, there was a problem that the period of time of data being actually output in response to designation of data output by the external control signal becomes longer as the number of data input/output terminals DQ0~DQn–1 is increased.

SUMMARY OF THE INVENTION

An object of the present invention is to provide a semiconductor memory device that can suppress time delay of data input/output even when the bit width of data input/output is increased.

According to an aspect of the present invention, a semiconductor memory device includes a memory cell array, a readout circuit, an output control signal generation circuit, a boosting circuit, a plurality of output control circuits, a plurality of signal lines, and a plurality of output circuits.

The memory cell array includes a plurality of memory cells arranged in a matrix. The readout circuit reads out a plurality of stored data from the selected memory cell in the memory cell array.

The output control signal generation circuit generates an output control signal that designates initiation of stored data output according to a control signal. The boosting circuit receives an external power supply potential to generate a drive potential higher than the external power supply potential.

The plurality of output control circuits generate a plurality of output permit signals with the drive potential as the active level in response to the output control signal.

The plurality of signal lines are provided corresponding to the plurality of output control circuits, respectively. Each of the plurality of signal lines transmits a corresponding one of the plurality of output permit signals. A plurality of output circuits are provided corresponding to each signal line. Each of the plurality of output circuits outputs from the semiconductor memory device a corresponding one of the plurality of stored data read out from the memory cell array.

The main advantage of the present invention is that the capacitance of the signal line driving each output control circuit is reduced so that time delay in data input/output can be suppressed even when the bit width of data input/output is increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
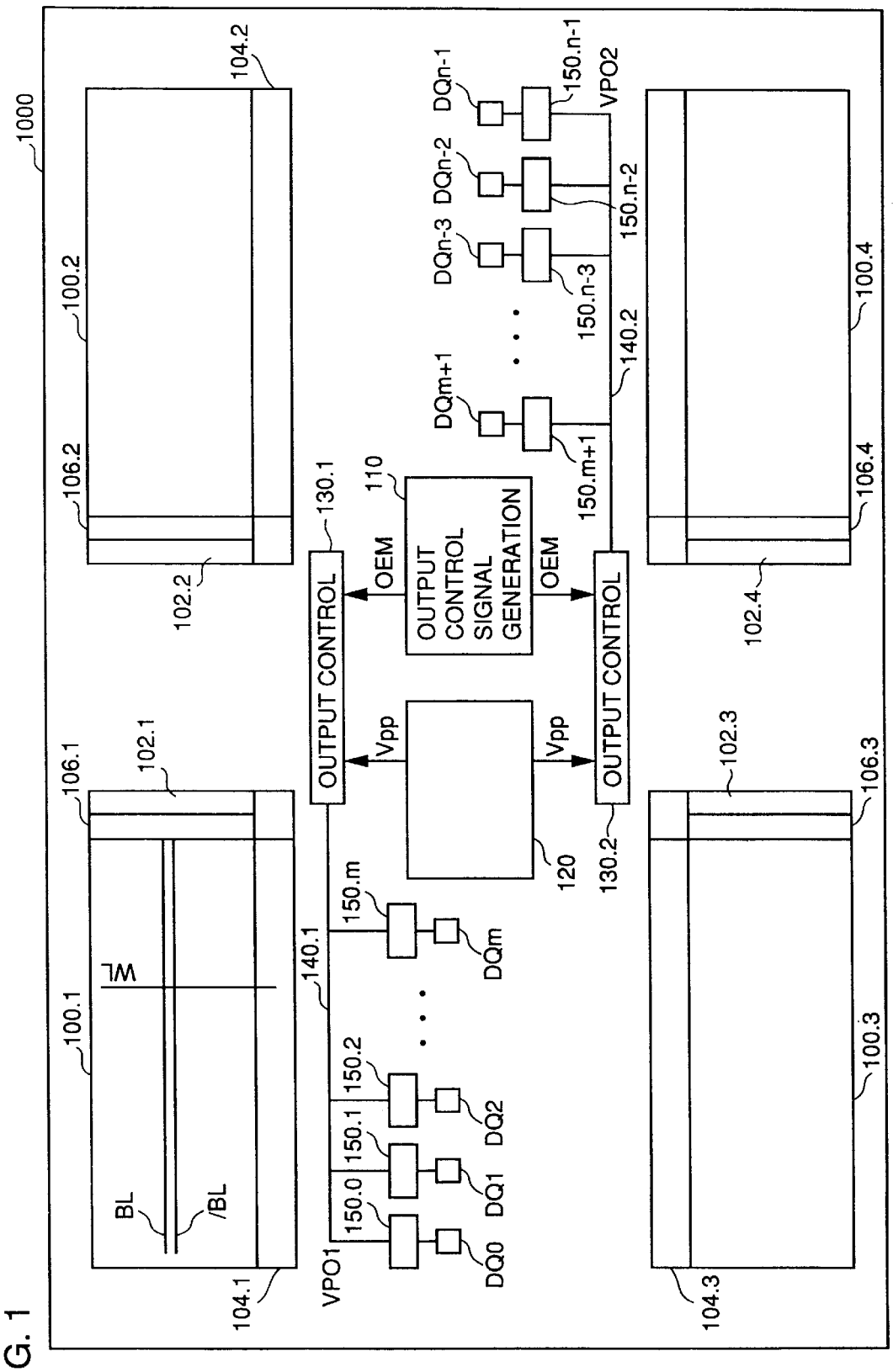
FIG. 1 is a schematic block diagram showing a structure of a semiconductor memory device 1000 according to an embodiment of the present invention.

Referring to FIG. 1, a semiconductor memory device 1000 of the present invention includes memory cell array blocks 100.1~100.4. Each of memory cell array blocks 100.1~100.4 includes memory cells (not shown) arranged in a matrix, a plurality of word lines WL arranged in the row direction of the memory cells, and a pair of bit lines BL,/BL arranged in the column direction of the memory cells.

Semiconductor memory device 1000 further includes row decoders 104.1~104.4 provided corresponding to memory cell array blocks 100.1~100.4, respectively, to select a memory cell row (word line) in a corresponding memory cell array block in response to an externally applied address signal, column decoders 102.1~102.4 provided corresponding to memory cell array blocks 100.1~100.4, respectively, to select a memory cell column (bit line pair) in a corresponding memory cell array block in response to an externally applied address signal, I/O gates 106.1~106.4 provided corresponding to column decoders 102.1~102.4, respectively, to send/receive data to/from a selected memory cell, an output control signal generation circuit 110 receiving external control signals of a row address strobe signal/RAS, a column address strobe signal/CAS, an output enable signal/OE and a write enable signal/WE to generate an output control signal OEM when data output is specified according to a combination of these control signals, a high voltage generation circuit 120 receiving an external power supply voltage Vcc and a ground potential GND to generate an internal voltage Vpp higher than external power supply voltage Vcc used in data output, an output control circuit 130.1 receiving the output of high voltage generation circuit 120 to provide a first output activation control signal VPO1 having an activation level corresponding to high voltage Vpp in response to activation of output control signal OEM, and an output control circuit 130.2 receiving the output of high voltage generation circuit 120 to output a second output activation control signal VPO 1 having an activation level corresponding to high voltage Vpp in response to activation of output control signal OEM.

High voltage generation circuit 120 includes, for example, but not exclusively, a charge pump circuit to generate potential Vpp.

Semiconductor memory device 1000 further includes data input/output terminals DQ0~DQn−1, output circuits 150.1~150.m provided corresponding to the left-half data input/output terminals DQ0~DQm (m=n/2−1) of semiconductor memory device 1000 out of data input/output terminals DQ0~DQn−1, having the timing controlled by first output activation control signal VPO1 to drive the potential levels of corresponding data input/output terminals DQ0~DQm according to respectively received readout data RD0~RDm, and output circuits 150.m+1~150.n−1 provided corresponding to the right-half data input/output terminals DQm+1~DQn−1 of semiconductor memory device 1000 out of data input/output terminals DQ0~DQn−1, having the timing controlled by second output activation control signal VPO2 to drive the potential levels of corresponding data input/output terminals DQm+1~DQn−1 according to read out data RDm+1~RDn−1 received respectively. A signal line 140.1 transmits signal VPO1 which is the output of output control circuit 130.1 to output circuits 150.1~150.m. A signal line 140.2 transmits signal VPO2 which is the output of output control circuit 130.2 to output circuits 150.m+1~150n−1.

Although not particularly limited, read out data RD0~RDm applied to data input/output terminals DQ0~DQm are read out from memory cell array blocks 100.1 and 100.3 via I/O gates 106.1 and 106.3, and transmitted to output circuits 150.0~150.m by a pair of I/O lines (not shown). Read out data RDm+1~RDn−1 applied to data input/output terminals DQm+1~DQn−1 are read out via I/O gates 106.2 and 106.4 from memory cell array blocks 100.2 and 100.4, and transmitted to output circuits 150.m+1~150n−1 through an I/O line pair (not shown).

Figure 2:
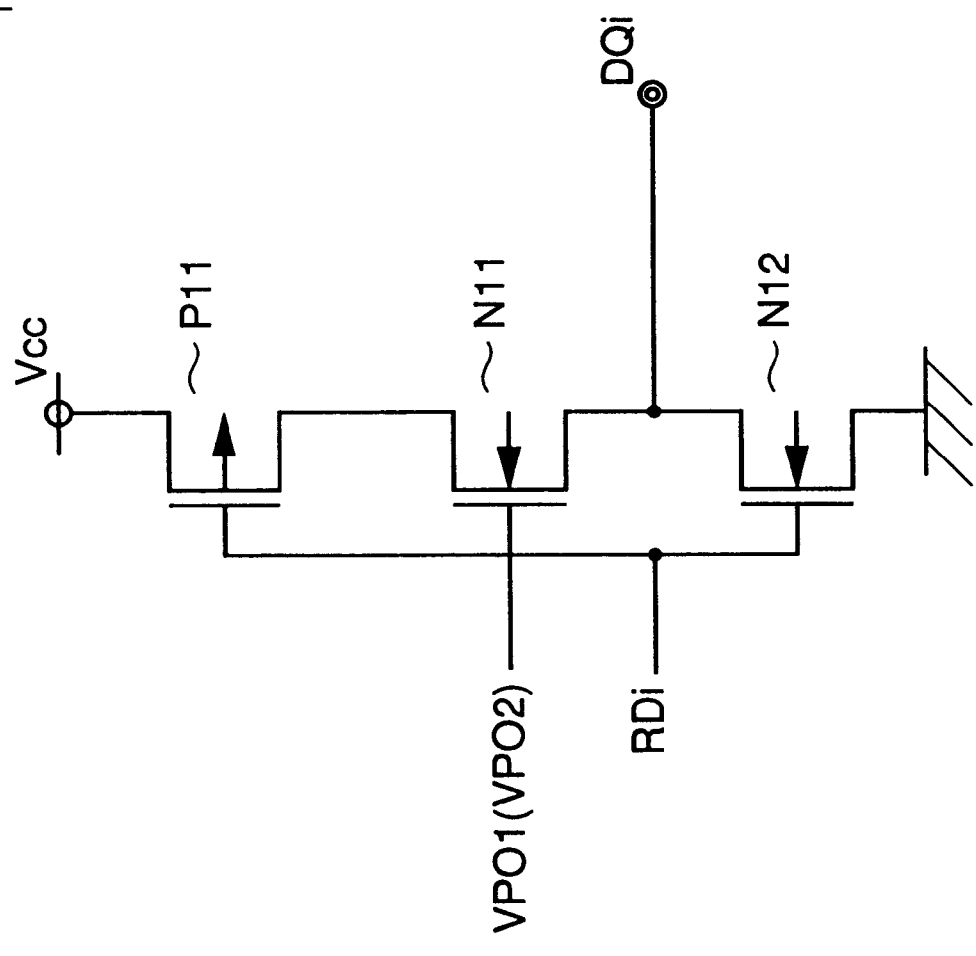
FIG. 2 is a circuit diagram to describe a structure of an output circuit 150.i (0≦i≦n–1) shown in FIG. 1.

FIG. 2 is a circuit diagram to describe the structure of output circuit 150.i ($0 \leq i \leq n-1$) shown in FIG. 1.

Output circuit 150.i includes a P channel MOS transistor P11 and N channel MOS transistors N11 and N12 connected in series between power supply potential Vcc and ground potential GND. Transistors P11 and N12 receive corresponding read out data RDi at their gates. Transistor N11 receives output activation control signal VPO1 (or VPO2) at its gate.

The activation level of signal VPO1 or VPO2 input to the gate of transistor N11 corresponds to the level of potential Vpp higher than the level of power supply potential Vcc. The value of potential Vpp is represented as set forth in the following using the threshold voltage Vth of transistor N11.

$$Vpp = Vcc + 2Vth \qquad (1)$$

When potential Vpp is lower than potential (Vcc+Vth), the potential level of data input/output terminal DQi does not rise to the level of potential Vcc even when transistors N11 and P11 both conduct and an H level (logical high) is provided to data input/output terminal DQi. Therefore, potential Vpp must attain the level of at least potential (Vcc+Vth). Also, it is desirable that potential Vpp is further higher than potential (Vcc+Vth) in order to reduce the on resistance of transistor N11 to shorten the access time. Therefore, the value of equation (1) is selected, though not particularly limited, as the value of potential Vpp.

Figure 3:
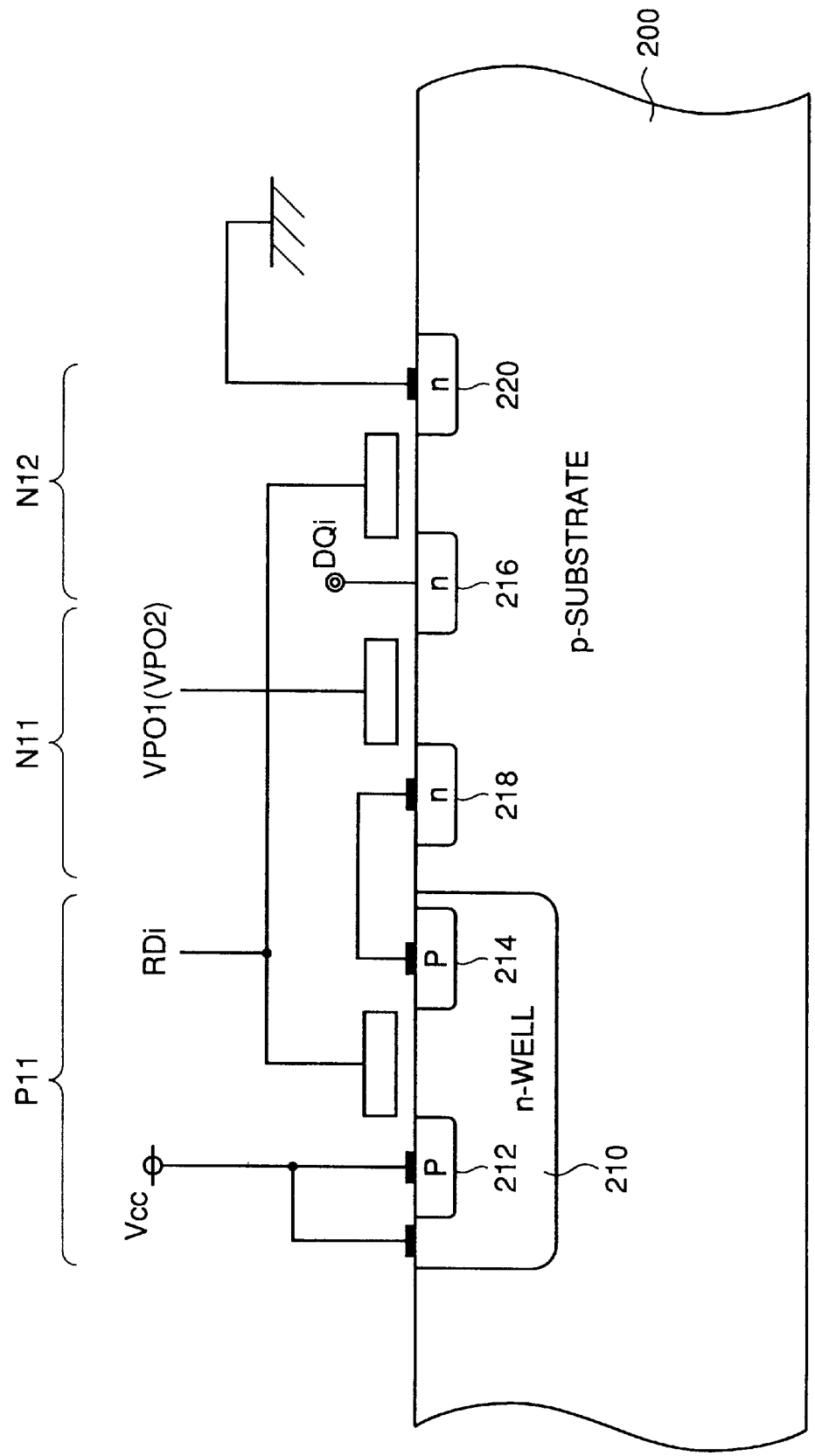
FIG. 3 shows a cross sectional structure of output circuit 150.i of FIG. 2.

FIG. 3 shows a cross sectional structure of output circuit 150.i of FIG. 2.

Referring to FIG. 3, P channel MOS transistor P11 is provided in an n-well 210 formed at the main surface of a p-Si substrate 200. More specifically, transistor P11 hasp type diffusion layers 212 and 214 formed in n-well 210 as the source and drain regions.

N channel MOS transistors N11 and N12 are provided at the main surface of p- Si substrate 200. N diffusion layer 212 shared by transistors N11 and N12 is coupled to data input/output terminal DQi. N type diffusion layer 218 of the drain region of transistor N11 is coupled to p type diffusion region 214 of the drain region of transistor P11. N type diffusion region 220 which is the source region of transistor N12 is coupled to ground potential GND.

If transistor N11 is absent, drain region 216 of transistor N12 and drain region 214 of transistor P11 will be coupled to each other, and drain regions 216 and 214 will be coupled to data input/output terminal DQi.

When data input/output terminal DQi is subjected to undershooting under this state so that the potential level of drain region 214 of transistor P11 becomes lower than the level of power supply potential Vcc and the gate potential of transistor P11 is maintained lower than power supply potential Vcc, hot carriers will be generated in the channel of transistor P11. These hot carriers will be introduced into the gate oxide film of transistor P11 to degrade the threshold value of transistor P11. Particularly output circuit 150.i is more susceptible to the generation of hot carniers since the transistor size is set greater than that of the transistors in other circuits in semiconductor memory device 1000 for the purpose of driving the potential level of data input/output terminal DQi.

In view of the foregoing, a structure is implemented as shown in FIG. 3 in which transistor N11 is provided. No current will flow to the channel of transistor N11 even when data input/output terminal DQi is subjected to undershooting as long as transistor N11 is off. Since no current flows to the channel of transistor P11, reliability of transistor P11 can be improved.

Figure 4:
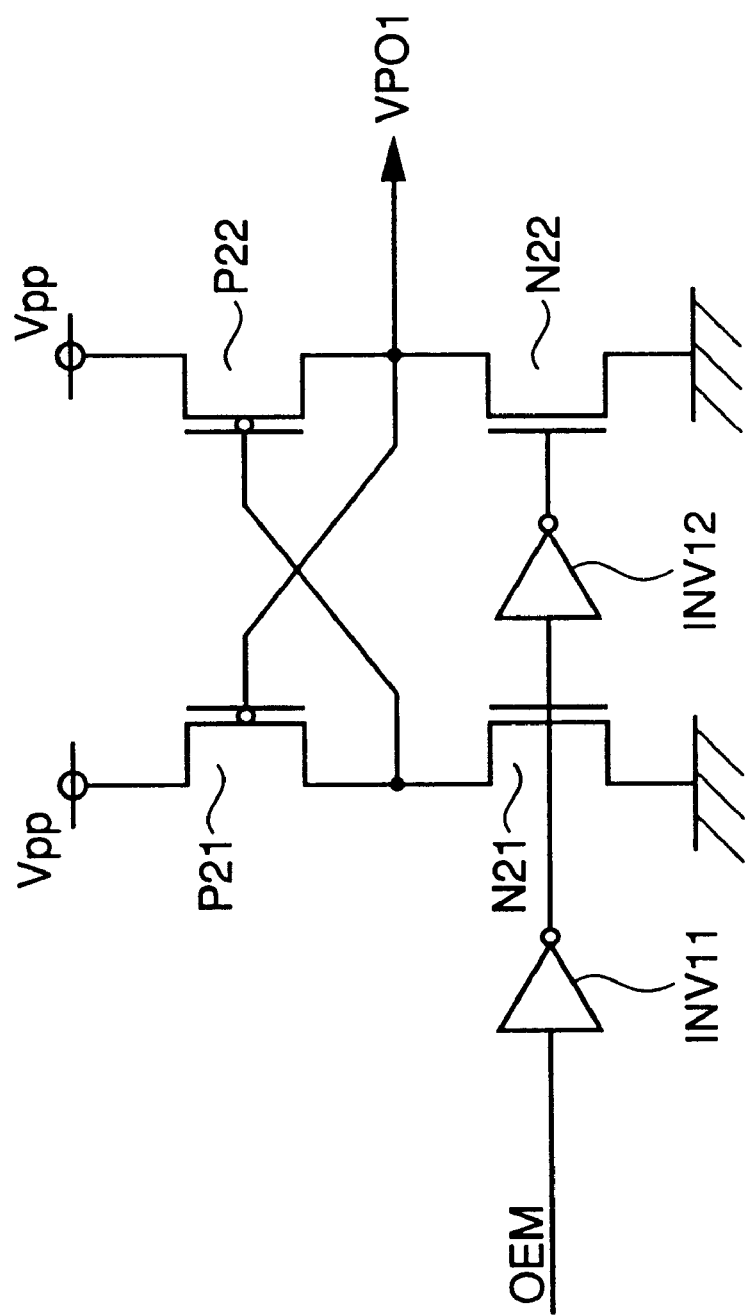
FIG. 4 is a circuit diagram to describe a structure of an output control circuit 130.1 of FIG. 1.

FIG. 4 is a circuit diagram to describe the structure of output control circuit 130.1 of FIG. 1. The structure of output control circuit 130.2 is basically similar to that of output control circuit 130.1, provided that the output signal is VPO2 instead of VPO1.

Referring to FIG. 4, output control circuit 130.1 includes an inverter INV11 receiving signal OEM, a P channel MOS transistor P21 and an N channel MOS transistor N21 connected in series between high voltage Vpp and ground potential GND, a P channel MOS transistor P22 and an N channel MOS transistor N22 connected in series between high voltage Vpp and ground potential GND, and an inverter INV12 receiving the output of inverter INV11.

Transistor N21 receives the output of inverter INV11 at its gate. Transistor N22 receives the output of inverter INV12 at its gate. Transistor P22 has its gate coupled to the connection node of transistors P21 and N21. Transistor P21 has its gate coupled to the connection node of transistors P22 and N22. The potential level of the connection node of transistors P22 and N22 is output as signal VPO1.

The operation of output control circuit 130.1 will be described briefly hereinafter. When output control signal OEM attains an active state (L level: ground potential GND level), the output of inverter INV11 is driven to an H level (potential Vcc level) and the output of inverter INV12 is driven to an L level (ground potential). In response, transistor N21 is rendered conductive, whereas transistor N22 attains a cut off state.

Therefore, the gate potential of transistor P22 attains the level of ground potential GND by transistor N21. As a result, transistor P22 is rendered conductive. In contrast, transistor P21 remains at the cut off state. Therefore, signal VPO1 attains an active state (potential Vpp level).

When output control signal OEM is at an inactive state (H level: potential Vcc level), transistor N22 conducts and transistor N21 is at a cut off state. Therefore, transistor P21 is rendered conductive and transistor P22 attains a cut off state. Therefore, the level of signal VPO1 attains an inactive state (potential GND level).

Figure 5:
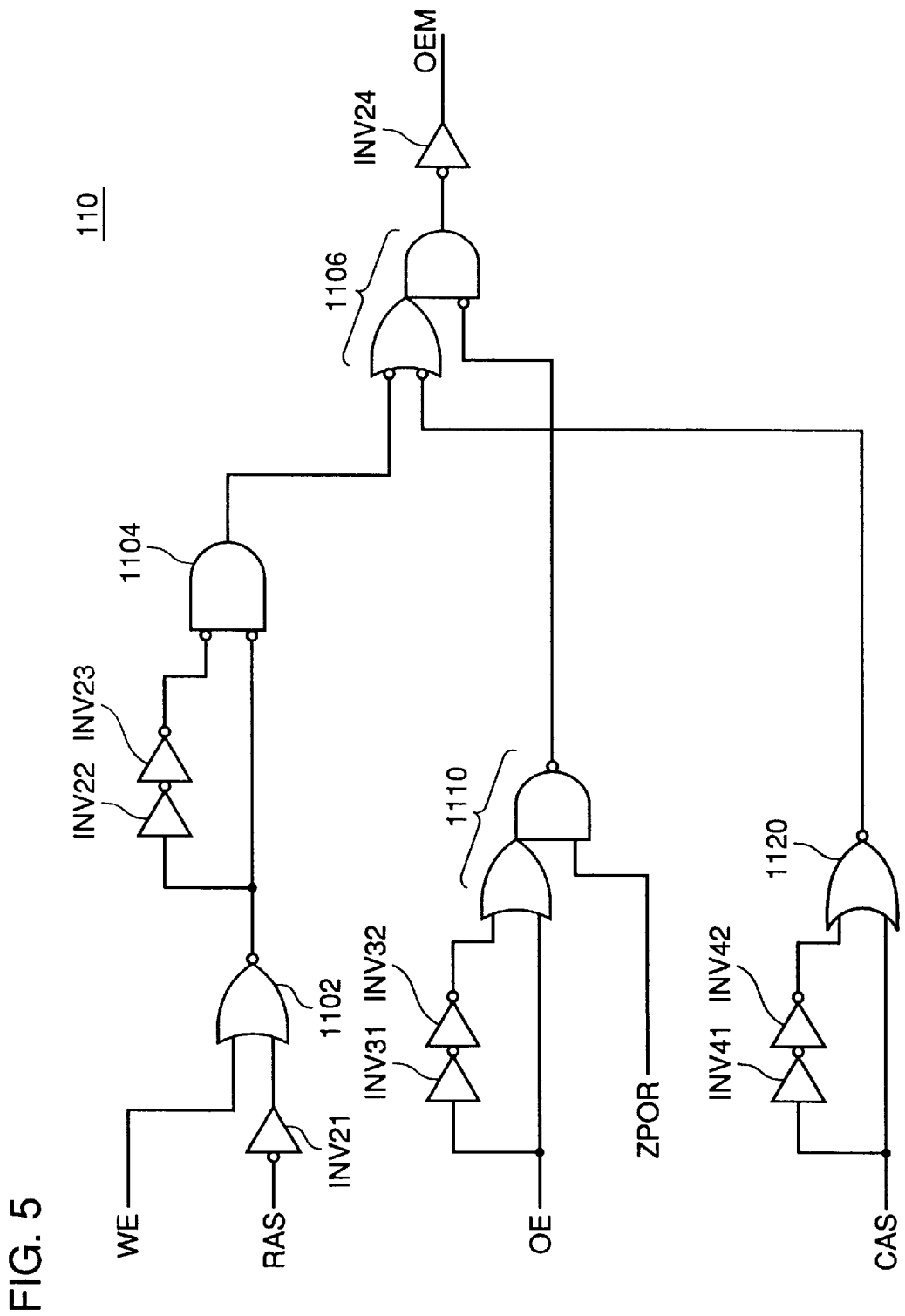
FIG. 5 is a block diagram showing a structure of an output control signal generation circuit 110 of FIG. 1.

FIG. 5 is a block diagram showing a structure of output control signal generation circuit 110 of FIG. 1.

Referring to FIG. 5, output control signal generation circuit 110 includes an inverter INV21 receiving a signal RAS which is an inverted version of row address strobe signal/RAS, an NOR circuit 1102 receiving a signal WE which is an inverted version of write enable signal/WE and the output of inverter INV21, an inverter INV22 receiving the output of NOR circuit 1102, an inverter INV23 receiving the output of inverter INV22, an NOR circuit 1104 receiving the outputs of NOR circuit 1102 and inverter INV23, an inverter INV31 receiving a signal OE which is an inverted version of output enable signal/OE, an inverter INV32 receiving the output of inverter INV31, a composite gate 1110 providing the NAND result of the level of a power on reset signal ZPOR with respect to the OR of the level of signal OE and the output level of inverter INV32, an inverter INV41 receiving a signal CAS which is an inverted version of column address strobe signal/CAS, and an inverter INV42 receiving the output of inverter INV41, and an NOR circuit 1120 receiving signal CAS and the output of inverter INV42.

Output control signal generation circuit 110 further includes a composite gate 106 providing the AND result of the inverted level of the output of composite gate 1110 with respect to the OR of the inverted level of the output of NOR circuit 1104 and the inverted level of the output of NOR circuit 1120, and an inverter INV24 receiving the output of composite gate 1106 to output signal OEM.

The power on reset signal attains an active state in response to the power-on of semiconductor memory device 1000, and maintains the H level I during the operating period.

Figure 6:
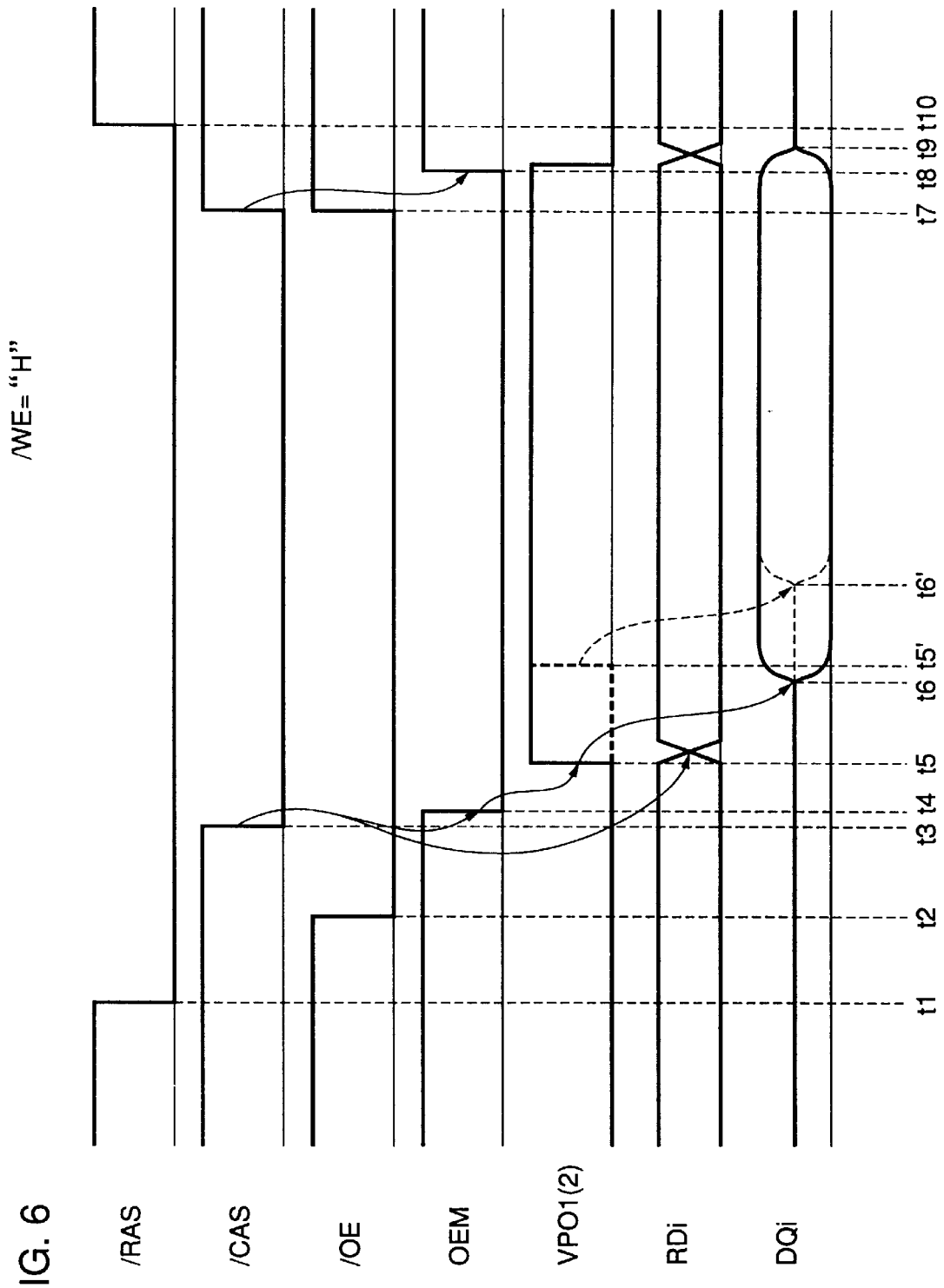
FIG. 6 is a timing chart to describe the operation of output control signal generation circuit 110, output control circuits 130.1 and 130.2, and output circuit 150.i (0≦i≦n–1).

FIG. 6 is a timing chart to describe the operation of output control signal generation circuit 1110, output control circuits 130.1 and 130.2, and output circuit 150.i ($0 \leq i \leq n-1$) shown in FIGS. 2, 4 and 5, respectively.

A read out operation will be described in the following with signal/WE at an inactive state (H level).

At time t1, signal/RAS is driven to an active state (L level). At time t2, signal/OE is rendered active (L level) to designate data output.

In response to the change in the level of the above signals, NOR circuit 1104 and composite gate 1110 in output control signal generation circuit 110 of FIG. 5 provide outputs of an L level.

In response to signal/CAS obtaining an active state (L level) at time t3, data is read out from memory cell blocks 100.1~100.4, and the output of NOR circuit 1120 of output control signal generation circuit 110 attains an L level. In response, signal OEM is driven to an active state (L level) at time t4.

In response to activation of signal OEM, signals VPO1 and VPO2 from output control circuits 130.1 and 130.2 respectively attain an active state (potential Vpp level) at time t5. In response to activation of signals VPO1 and VPO2, data is output from output circuit 150.i to data input/output terminal DQi at time t6.

At time t7, signals/CAS and/OE are driven inactive. At time t8, signal OEM is also driven inactive. At time t9, data output is completed, and data input/output terminal DQi attains a high impedance state. At time t10, signal/RAS returns to the inactive state.

Figure 7:
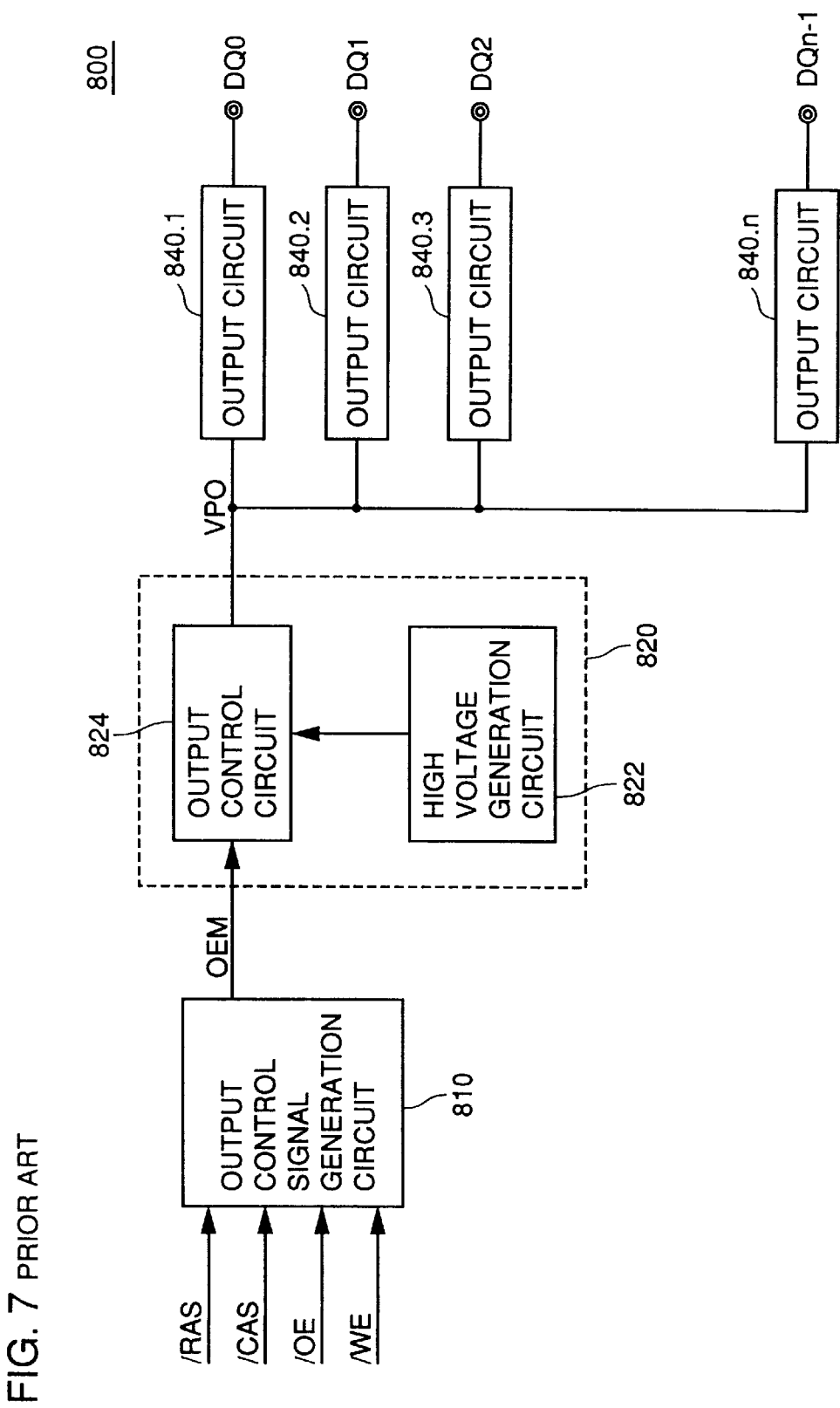
FIG. 7 is a schematic block diagram showing a structure of an output circuit 800 controlling the data output timing in a conventional semiconductor memory device.

In FIG. 6, the operation waveform of conventional data output circuit 100 of FIG. 7 is represented by the dotted line. It is to be noted that two output control circuits 130.1 and 130.2 are provided in the present invention shown in FIG. 1. Therefore, output control circuit 130.1 outputs signal VPO1 by driving signal line 140.1 corresponding to output circuits 150.1~150.m. Output control circuit 130.2 outputs signal VP02 by driving signal line 140.2 corresponding to output circuits 150.m+1~150.n−1.

This is comparative to the structure of conventional data output circuit 800 of FIG. 7 where output control circuit 824 drives all output circuits 840.1~840.n. Therefore, as indicated by the dotted line in FIG. 6, following activation of signal OEM at time t4, signal VPO is rendered active at time t5' later than time t5, and data is output to data input/output terminal DQi at time t6' later than time t6.

Therefore, the capacitance of the signal line driven by output control circuit 130.1 or 130.2 is reduced, so that the access time starting from the designation of data output to actual data output can be shortened in the present invention.

Although two output control circuits are provided, the present invention is not limited to this case. More generally, N (N: natural number) output control circuits 130.1~130.N are provided. Each of output control circuits 130.1~130.N can drive a corresponding output circuit out of the plurality of output circuits by providing an output control signal to a corresponding signal line out of the plurality of signal lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a memory cell array including a plurality of memory cells arranged in a matrix;
    a read out circuit reading out a plurality of stored data from a selected memory cell in said memory cell array;
    an output control signal generation circuit generating an output control signal designating initiation of stored data output according to a control signal;
    a boosting circuit receiving an external power supply potential and generating a drive potential differing from said external power supply potential;
    a plurality of output control circuits generating a plurality of output permit signals with an active level of said drive potential according to said output control signal;
    a plurality of signal lines provided corresponding to said plurality of output control circuits, respectively, each signal line transmitting a corresponding output permit signal out of said plurality of output permit signals; and
    a plurality of output circuits provided corresponding to each of said plurality of signal lines, each output circuit providing outside said semiconductor memory device corresponding stored data out of said plurality of stored data read out from said memory cell array.

2. The semiconductor memory device according to claim 1, said semiconductor memory device being provided at a memory region on a main surface of a semiconductor substrate,
    wherein said memory cell array is divided into a plurality of memory cell blocks and arranged in said memory region,
    at least said output control signal generation circuit and said plurality of output control circuits being provided at a center region surrounded by said plurality of memory cell blocks in said memory region,
    wherein said signal line is arranged from said center region towards a periphery of said memory region.

3. The semiconductor memory device according to claim 2, wherein said drive potential is higher than said external power supply potential,
    wherein each of said plurality of output control circuits raises a level of said output permit signal from a reference potential lower than said external power supply potential to said drive potential in response to activation of said output control signal.

4. The semiconductor memory device according to claim 3, wherein each of said plurality of output control circuits comprises
    a P channel type first MOS transistor and an N channel type second MOS transistor connected in series between the reference potential lower than said external power supply potential and said drive potential, and
    a P channel type third MOS transistor and an N channel type fourth MOS transistor connected in series between said reference potential and said drive potential,
    wherein
        a first node which is a connection node of said first and second MOS transistors is coupled to a gate of said third MOS transistor,
        a second node which is a connection node of said third and fourth MOS transistors is coupled to a gate of said first MOS transistor,
        said second MOS transistor attains a conductive state in response to activation of said output control signal,
        said fourth MOS transistor attains a conductive state in response to inactivation of said output control signal, and
        a potential level of said second node is output as said output permit signal.

5. The semiconductor memory device according to claim 3, wherein each of said plurality of output circuits comprises a P channel type pull up MOS transistor, an N channel type cut off MOS transistor and an N channel type pull down MOS transistor provided in series between a first potential corresponding to a first level of output data and a second potential corresponding to a second level of said output data,
    wherein
        said pull up MOS transistor and said pull down MOS transistor receive a signal corresponding to read out said stored data at their gates, and
        said cut off MOS transistor attains a conductive state according to activation of said output permit signal.

6. The semiconductor memory device according to claim 5, wherein said semiconductor substrate has P type conductivity,
    wherein said pull up MOS transistor is provided within an N type well provided at a main surface of said semiconductor substrate, and
    said cut off MOS transistor and said pull down MOS transistor are provided at a main surface of said semiconductor substrate.

7. The semiconductor memory device according to claim 2, said memory region being rectangular in shape,
    said memory cell array being divided into four memory cell array blocks,
    wherein said plurality of signal lines comprises
        a first line sandwiched between first and second memory cell array blocks out of said four memory cell array blocks, and extending from said center region in a longer side direction of said memory region, and
        a second line sandwiched between third and fourth memory cell array blocks out of said four memory cell array blocks, and extending in a direction opposite to the direction of said first line,
    said semiconductor memory device further comprising:
        a plurality of first input/output terminals arranged in a region sandwiched between said first and second memory cell array blocks: and
        a plurality of second input/output terminals arranged in a region sandwiched between said third and fourth memory cell array blocks.

8. The semiconductor memory device according to claim 7, wherein said drive potential being higher than said external power supply potential,
    wherein each of said plurality of output control circuits comprises
        a P channel type first MOS transistor and an N channel type second MOS transistor connected in series between a reference potential lower than said external power supply potential and said drive potential, and
        a P channel type third MOS transistor and an N channel type fourth MOS transistor connected in series between said reference potential and said drive potential,
    wherein
        a first node which is a connection node of said first and second MOS transistors is coupled to a gate of said third MOS transistor, a second node which is a connection node of said third and fourth MOS transistors is coupled to a gate of said first MOS transistor, said second MOS transistor attains a conductive state in response to activation of said output control signal, said fourth MOS transistor attains a conductive state in response to inactivation of said output control signal, and a potential level of said second node is output as said output permit signal.

9. The semiconductor memory device according to claim 8, wherein each of said plurality of output circuits comprises a P channel type pull up MOS transistor, an N channel type cut off MOS transistor and an N channel type pull down MOS transistor provided in series between a first potential corresponding to a first level of output data and a second potential corresponding to a second level of said output data, wherein said pull up MOS transistor and said pull down MOS transistor receive a signal corresponding to read out said stored data at their gates, and said cut off MOS transistor attains a conductive state according to activation of said output permit signal.

10. The semiconductor memory device according to claim 9, wherein said semiconductor substrate has P type conductivity, wherein said pull up MOS transistor is provided within an N type well provided at a main surface of said semiconductor substrate, and said cut off MOS transistor and said pull down MOS transistor are provided at a main surface of said semiconductor substrate.

* * * * *